United States Patent [19]

Goto et al.

[11] Patent Number: 5,294,884
[45] Date of Patent: Mar. 15, 1994

[54] HIGH SENSITIVE AND HIGH RESPONSE MAGNETOMETER BY THE USE OF LOW INDUCTANCE SUPERCONDUCTING LOOP INCLUDING A NEGATIVE INDUCTANCE GENERATING MEANS

[75] Inventors: Eiichi Goto, Fujisawa; Yutaka Harada, Tokyo, both of Japan

[73] Assignee: Research Development Corporation of Japan, Tokyo, Japan

[21] Appl. No.: 95,474

[22] Filed: Jul. 23, 1993

Related U.S. Application Data

[63] Continuation of Ser. No. 988,392, Dec. 9, 1992, abandoned, which is a continuation of Ser. No. 684,957, May 13, 1991, abandoned.

[30] Foreign Application Priority Data

Sep. 14, 1989 [JP] Japan .................................. 1-239219

[51] Int. Cl.$^5$ ............................................ G01R 33/035
[52] U.S. Cl. ............................................ 324/248; 505/846
[58] Field of Search ............... 324/248, 225, 227, 307, 324/309, 318; 307/306; 505/844–846

[56] References Cited

U.S. PATENT DOCUMENTS

| | | | |
|---|---|---|---|
| 3,725,819 | 4/1973 | Fulton | 324/248 X |
| 4,851,776 | 7/1989 | Goto et al. | 324/248 |
| 4,866,373 | 9/1989 | Harada et al. | 324/248 X |
| 4,875,010 | 10/1989 | Yokosawa et al. | 324/248 |
| 4,923,850 | 5/1990 | Stephan et al. | 324/248 X |
| 5,021,739 | 6/1991 | Yokosawa et al. | 324/248 |

Primary Examiner—Gerard R. Strecker
Assistant Examiner—Warren S. Edmonds
Attorney, Agent, or Firm—Keck, Mahin & Cate

[57] ABSTRACT

A magnetometer comprising a superconducting loop including a magnetic flux detecting coil and a SQUID (Superconducting QUantum Interference Device) connected to the superconducting loop via magnetic flux. A negative inductance generating device is provided having two terminals for generating a negative inductance defined by the value of the derivative of generalized magnetic flux between the two terminals with current flowing between the terminals (d$\Phi$/dI) being negative. The inductance of the superconducting loop is decreased by the negative inductance generating device and input signals intensified by the negative inductance generating device are detected by the SQUID. A plurality of the superconducting loops may be provided to construct a gradiometer and a variable negative inductance generating device is provided to the respective superconducting loop to equalize and intensify the sensitivities of the detection coils.

5 Claims, 4 Drawing Sheets

HIGH SENSITIVE AND HIGH RESPONSE MAGNETOMETER BY THE USE OF LOW INDUCTANCE SUPERCONDUCTING LOOP INCLUDING A NEGATIVE INDUCTANCE GENERATING MEANS

This is a continuation of application Ser. No. 07/988,392, filed Dec. 9, 1992, now abandoned, which is a continuation of Ser. No. 07/684,957 filed May 13, 1991 now abandoned.

TECHNICAL FIELD

This invention relates to very high-sensitive magnetometers using Josephson devices.

BACKGROUND ART

Magnetometers using a SQUID(Superconducting QUantum Interference Device) have been known. These magnetometers have very excellent sensitivity and response and they are used in the field of high precession and high sensitive measurements. By means of the magnetometer using the SQUID, weak magnetic filed signals produced from a human body can be detected and geographical surveys such as searches for oil reservoirs, high-temperature water reservoirs, etc. can be carried out with high precision.

The magnetometers have a flux detecting coil(pick-up coil) for catching signal flux. This caught flux is fed to the SQUID which is magnetically coupled with a superconducting loop including the detecting coil.

Due to the inductance of the superconducting loop including the detecting coil for catching the signal flux, there is an unresolved problem that the high-sensitive and high-response characteristics of the SQUID have not fully been used.

DISCLOSURE OF THE INVENTION

This invention resolves the above problem by providing negative inductance generating means including the Josephson device for the superconducting loop which has the magnetic flux detecting coil for transmitting the signal flux to the SQUID.

We will explain characteristics of the Josephson device using FIG. 2. The characteristics of the Josephson device 100, that is, a current $I_j$ flowing through the device and a voltage $V_j$ across the device 100 are represented by the following equation, using a maximum superconducting current $I_m$ and an electron wave phase difference $\Psi_j$ of the Josephson device 100.

$$I_j = I_m \sin \Psi_j, \quad (1)$$

$$V_j = \frac{\Phi_0}{2\pi} \frac{d\Psi_j}{dt}, \quad (2)$$

where $\Phi_0$ is the magnetic flux quantum of $2.07 \times 15^{-}$wb. Operation can be generally discussed if a time-integrated value of the voltage $V_j$ across the Josephson device 100 is defined as a generalized magnetic flux $\phi_j$ as follows:

$$\Phi_j = \int V_j dt = \frac{\Phi_0}{2\pi} \Psi_j. \quad (3)$$

It can be seen from Eq.(3) that the magnetic flux $\phi_j$ of the Josephson device 100 is proportional to the electron wave phase difference $\Psi_j$. Although the Josephson device has been dealt as a switching element, Eqs. (1) to (3) show that the Josephson device has the characteristics of an inductor. Especially, Eq. (1) shows that the Josephson device has a nonlinear inductance $L_j$. A differential inductance of the Josephson device is calculated by Eq.(4), $$L_j = \frac{d\Phi_j}{dI} = \frac{\frac{d\Phi_j}{d\Psi_j}}{\frac{dI}{d\Psi_j}} = \frac{\frac{\Phi_0}{2\pi}}{I_m \cos \Psi_j}. \quad (4)$$

From Eq(4), it can be seen that by use of the electron wave phase difference $\Psi_j$ the Josephson device has a variable inductance in connection with $\cos \Psi_j$. In particular, while $\Psi_j$ is $\pi/2$ to $3\pi/2$, $\cos \Psi_j$ is negative and the Josephson device shows a negative inductance.

FIG. 3 shows a variable inductor realizing a negative inductance, comprising a single Josephson device. A Josephson device 100 is connected in serial with an inductor 101. An external current $I_{ex}$ is supplied from a current source 102. By varying the external current $I_{ex}$ a direct current bias magnetic flux $\Phi_{ex}$ applied to the Josephson device is changed, then the electron wave phase difference $\Psi_j$ of the Josephson device 100 is changed to generate a negative inductance between terminals 205 and 206. FIG. 4 shows a symbol representing the variable negative inductance generating means and illustrating that an inductance value $L^*$ is changed by the external current $I_{ex}$.

FIG. 5 is an example of the variable inductance generating means which realizes a negative inductance and comprises two Josephson devices. A first and a second Josephson devices 100a and 100b of the maximum superconducting current $I_m$ are provided at opposite ends of a first and a second secondary windings 202a and 202b of a tight-coupling transformer 203. A connection point of the first and the second Josephson devices 100a and 100b is connected to a terminal 206 and a connection point of the first and the second secondary windings 202a and 202b is connected to a terminal 205. A primary winding 201 of the tight-coupling transformer 203 is connected to a direct current source 207. Next, operation of this circuit will be explained. The primary winding 201 of the tight-coupling transformer 203 is supplied with a direct current $I_{ex}$ from the current source 207 to pass a direct current bias magnetic flux $\Phi_{ex}$ through the first and the second secondary windings 202a and 202b. When the flux $\Phi_{ex}$ is normarized by the flux quantum $\Phi_o$, it becomes an electron wave phase angle $\alpha$, $$\alpha = 2\pi \frac{\Phi_{ex}}{\Phi_0}. \quad (5)$$

When the phase angle between the terminals 205 and 206 is defined as $\phi$, currents flowing through the first and the second Josephson devices 100a and 100b are $I_m \sin(\phi - \alpha)$ and $I_m \sin(\phi + \alpha)$. Therefore, the currents flowing through the terminals 205 and 206 are represented by the following equation (6):

$$\begin{aligned} I &= I_m \sin(\phi - \alpha) + I_m \sin(\phi + \alpha) \\ &= 2I_m \sin\phi \cos\alpha \end{aligned} \quad (6)$$

Since the phase angle between the terminals 205 and 206 is $\Phi$, the generalized flux for $\Phi$ between the terminals is $\phi\Phi_0/2\pi$. Therefore, the inductance $L^*$ between the terminals 205 and 206 becomes Eq. (7) through a calculation similar to Eq. (4), $$L^* = \frac{\frac{d\Phi}{d\phi}}{\frac{dI}{d\phi}} = \frac{\frac{\Phi_0}{2\pi}}{2I_m\cos\alpha\cos\phi} \quad (7)$$

According to Eq(7), the inductance between the terminals 205 and 206 varies with the phase angle $\alpha$. Thus, the circuit shown in FIG. 5 realizes a variable inductance which is controlled by an external current $I_{ex}$ flowing through the primary winding 201. Especially when the phase angle $\alpha$ is from $\pi/2$ to $3\pi/2$, its cosine value is negative and it is convenient to realize a negative inductance. This negative inductance generating means has an advantage of high immunity against external noises as compared with the negative inductance generating means shown in FIG. 3.

In the negative inductance generating means shown in FIG. 5, it is apparent that the terminals 205 and 206 can be also used as the bias magnetic flux supplying port and the primary winding of the transformer 203 can be used as the negative inductance supplying port.

FIG. 6 shows an example of the direct current bias magnetic flux supplying means used in the negative inductance generating means shown in FIG. 5. A superconducting line 210 is provided for bridging the superconducting line 209 which is extended from the primary winding 201 of the transformer 203. When the external current $I_{ex}$ is injected or changed, the state of the superconducting line 210 is changed to a normal conducting(resistive) state by heat or a magnetic filed generated by driving a heater 211 or a magnetic field generating means 212 which is provided adjacent to the superconducting line 210. After a bias current $I_B$ of a predetermined value flows, the state of the superconducting line is returned to the superconducting state. The primary winding 201 of the transformer 203 and the superconducting line 210 make up a superconducting loop, around which a superconducting circulating current of the predetermined value flows to supply a bias magnetic flux. This procedure is very effective because there is no influence of external noises.

BEST MODE FOR CARRYING OUT THE INVENTION

Figure 1:
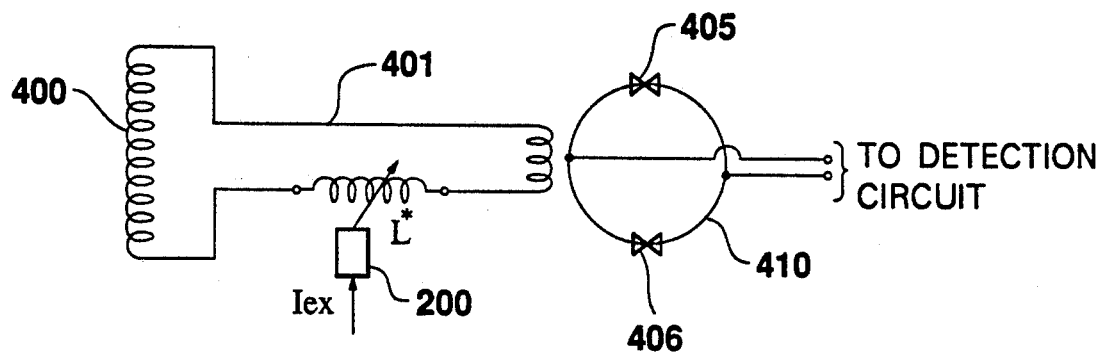
FIG. 1 is a magnetometer using a negative inductance generating means according to this invention.
Figure 2:
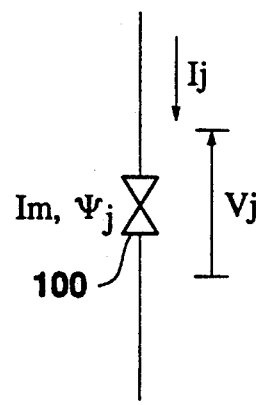
FIG. 2 is a drawing illustrating characteristics of a Josephson device.
Figure 3:
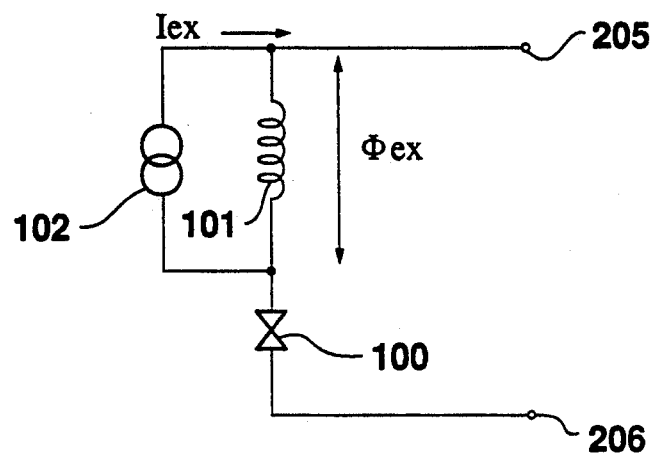
FIG. 3 is a circuit diagram of a negative inductance generating means using a single Josephson device.
Figure 4:
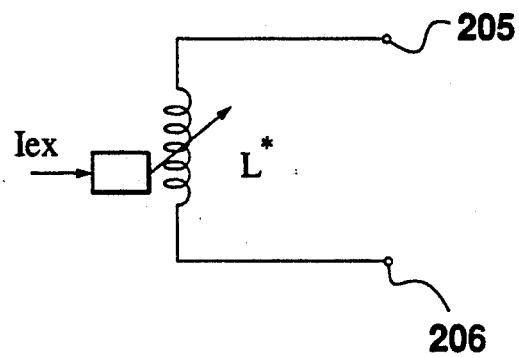
FIG. 4 is a symbol of the negative inductance generating means.
Figure 5:
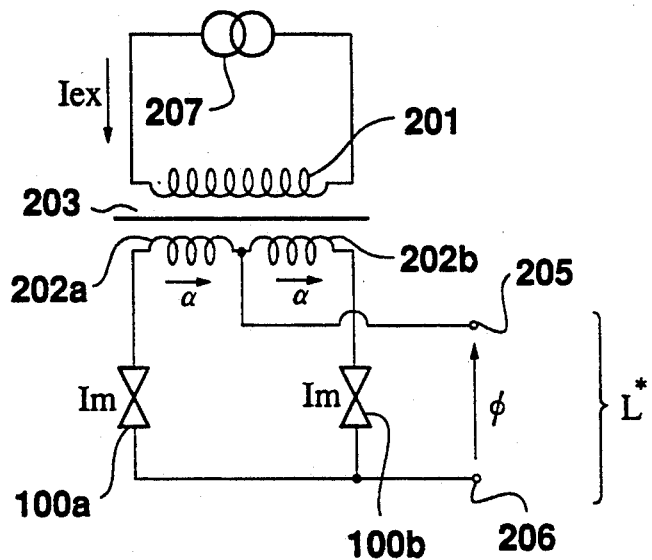
FIG. 5 is a circuit diagram of a negative inductance generating means using two Josephson devices.
Figure 6:
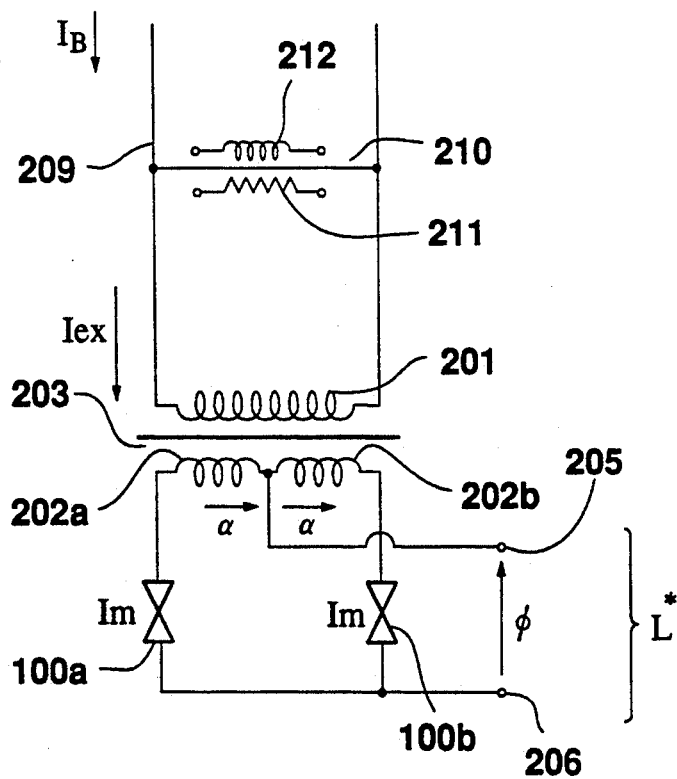
FIG. 6 is a drawing showing an example of a bias magnetic flux supplying means.

Hereinafter, this invention will be illustrated with reference to the drawings FIG. 1 is a schematic diagram of a first example of this magnetometer.

A variable inductor 200 realizing a negative inductance is connected in serial with a superconducting loop 400, at one end of which a magnetic flux detecting coil 400 is provided and at another end of which a SQUID as a magnetic flux sensor is magnetically coupled. If negative inductance of the negative inductor 200 is adjusted so as to cancel inductance of the other portion of the superconducting loop 400, a large current corresponding to a signal flux change flows through the superconducting loop in a moment. As a result, a large magnetic flux is applied to the SQUID and the signal flux can be detected with a high-sensitivity and a high-speed. In this example, as the magnetic flux sensor a DC-SQ0ID 410 with two Josephson devices 405 and 406 is used. But, a RF-SQUID can be naturally used, instead. Detection circuits used with the DC-SQUID or the RF-SQUID are well known. For example, refer to "Introduction to Cryo-electronics" (author: Akira Nakamura, publisher: Ohm-sha).

Figure 7:
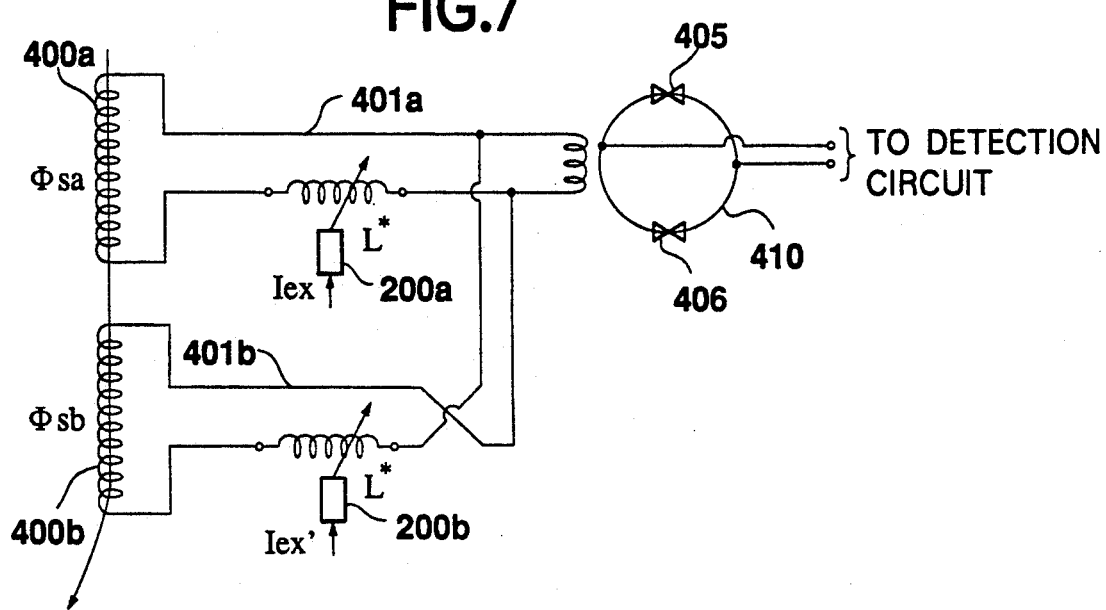
FIG. 7 is a schematic diagram of a magnetometer having a differential magnetic flux detecting means.

FIG. 7 is a schematic diagram of another example of this invention, that is, a magnetometer having differential magnetic flux detection coils. Generally, in order to detect a very weak magnetic flux by use of a SQUID, a so-called gradiometer is adopted. In the gradiometer picks up signals at different locations by two magnetic flux detection coils and detects the difference of the signals to exclude influence of noises. In this case, in order to obtain a high measurement accuracy, it is necessary to precisely adjust the sensitivities of two magnetic flux detection coils. In this gradiometer, as shown in FIG. 7, a superconducting loop 401$a$ including a magnetic flux detecting coil 400$a$ and a superconducting loop 401$b$ including magnetic flux detecting coil 400$b$ have a common portion in a portion coupled with the SQUID 410. In this common portion, currents of opposite flowing directions are generated for a detected magnetic flux of the same direction. Therefore, a difference signal between input fluxes $\Phi_{sa}$ and $\Phi_{sb}$ is detected by the SQUID. Variable negative inductance generating means 401$a$ and 401$b$ are provided in the superconducting loops 401$a$ and 401$b$, respectively. By adjusting the inductances thereof with external currents $I_{ex}$ and $I_{ex}'$, the sensitivities of the magnetic flux detection coils 400$a$ and 400$b$ are made equal to attain a high measurement accuracy. The inductances of the loops 401$a$ and 401$b$ can be reduced to increase the sensitivities.

It is practically very advantageous that the sensitivities of the coils can be adjusted on a measuring spot.

Moreover, there is nothing to say that this invention is also effective for gradiometers having more than two magnetic flux detection coils.

As described above, according to this invention, very high sensitive magnetometers can be realized. In the gradiometers, since the sensitivities of the differential detecting coils are completely equalized, measurement of signal flux can be carried out without any influence of external noises.

It will be apparent to those skilled in the art that various modifications and variations can be made in the invention without departing from the scope or spirit of the invention. Thus, it is intended that this invention covers the modifications and variations of this invention provided they come within the scope of the appended claims and their equivalents.

We claim:

1. In a magnetometer comprising a superconducting loop including a magnetic flux detecting coil and a SQUID connected to the superconducting loop via magnetic flux, negative inductance generating means having two terminals for generating a negative inductance between said terminals being provided in the superconducting loop, said negative inductance generating means comprising at least one of a Josephson device and a direct current source of applying a direct current bias magnetic flux to the Josephson device and said negative inductance being defined by that the value of the derivative of generalized magnetic flux between said two terminals with current flowing between the terminals, that is, $(d\phi, dI)$ is negative, whereby the inductance of the superconducting loop is decreased by said negative inductance generating means and input signals intensified by said negative inductance generating means are detected by the SQUID.

2. A magnetometer claimed in claim 1, wherein said negative inductance generating means comprises two Josephson devices these Josephson devices are coupled with said direct current source through a superconducting winding transformer, one of the Josephson devices is supplied with a sum magnetic flux of the generalized magnetic flux between said two terminals and said bias magnetic flux, and the other of the Josephson devices is supplied with a difference magnetic flux of said generalized magnetic flux and said bias magnetic flux.

3. A magnetometer claimed in claim 1, wherein the current supplied with the direct current source is variable whereby the inductance of said negative inductance generating means is adjustable.

4. A magnetometer claimed in claim 1, wherein said direct current source comprises a superconducting loop including a superconducting switch.

5. In a magnetometer comprising a plurality of superconducting loops, each having a magnetic flux detecting coil, and a SQUID connected to the superconducting loop via magnetic flux, variable negative inductance generating means having two terminals for generating a negative inductance between said terminals being provide din the respective superconducting loops, said negative inductance generating means comprising at least one of a Josephson device and a direct current source for applying a direct current bias magnetic flux to the Josephson device and said negative inductance being defined by that the value of the derivative of generalized magnetic flux between said two terminals with current flowing between the terminals, that is, $(d\phi/dI0$ is negative, whereby the sensitivities of detection coils are equalized and intensified by adjusting the negative inductances.

* * * * *